(12) United States Patent
Leman et al.

(10) Patent No.: US 10,523,143 B2
(45) Date of Patent: Dec. 31, 2019

(54) SENSORLESS BDLC CONTROL

(71) Applicant: Melexis Bulgaria Ltd., Sofia (BG)

(72) Inventors: Dirk Leman, Lier (BE); Xing Zuo, ShenZhen (CN)

(73) Assignee: MELEXIS BULGARIA LTD, Sofia (BG)

( * ) Notice: Subject to any disclaimer, the term of this patent is extended or adjusted under 35 U.S.C. 154(b) by 0 days.

(21) Appl. No.: 16/025,026

(22) Filed: Jul. 2, 2018

(65) Prior Publication Data

US 2019/0013750 A1 Jan. 10, 2019

(30) Foreign Application Priority Data

Jul. 4, 2017 (EP) .................................... 17179574

(51) Int. Cl.
*H02P 6/26* (2016.01)
*H02P 6/182* (2016.01)
*H02P 6/08* (2016.01)
*H02P 6/15* (2016.01)
*H02P 6/28* (2016.01)
*G01R 19/00* (2006.01)

(52) U.S. Cl.
CPC .......... *H02P 6/182* (2013.01); *G01R 19/0092* (2013.01); *H02P 6/085* (2013.01); *H02P 6/157* (2016.02); *H02P 6/26* (2016.02); *H02P 6/28* (2016.02)

(58) Field of Classification Search
CPC .... H02P 6/16; H02P 6/18; H02P 6/182; H02P 25/08
See application file for complete search history.

(56) References Cited

U.S. PATENT DOCUMENTS 5,134,349 A * 7/1992 Kruse ..................... H02P 6/182
  318/400.34
5,986,418 A * 11/1999 Horst ..................... H02P 25/08
  318/254.2

(Continued)

FOREIGN PATENT DOCUMENTS

| EP | 1612925 B1 | 7/2014 |
| EP | 2037567 B1 | 10/2014 |
| JP | 2005176434 A | 6/2005 |

OTHER PUBLICATIONS

Extended European Search Report from EP Application No. EP 17179574.3, dated Dec. 21, 2017.

*Primary Examiner* — Rina I Duda
(74) *Attorney, Agent, or Firm* — Workman Nydegger

(57) ABSTRACT

A method for controlling a single-coil BLDC motor, the method comprising: monitoring a signal indicative of a time derivative of a phase current through the coil of the BLDC motor during at least one commutation cycle; determining a first moment of the at least one commutation cycle such that at the first moment the absolute value of the time derivative of the phase current is smaller than or equal to a slope threshold; determining a rising edge of a driving signal in a commutation cycle, based on the first moment of that commutation cycle and/or based on the first moment of at least one earlier commutation cycle, and/or determining a falling edge of the driving signal in that commutation cycle based on the first moment of at least one earlier commutation cycle; driving the single-coil BLDC motor using the driving signal.

21 Claims, 8 Drawing Sheets

(56) References Cited

U.S. PATENT DOCUMENTS

| | | | |
|---|---|---|---|
| 8,624,532 B2 * | 1/2014 | Chuah | H02P 6/18 318/400.01 |
| 9,515,588 B2 | 12/2016 | Bateman et al. | |
| 9,602,032 B2 | 3/2017 | Kim et al. | |
| 2006/0214611 A1 | 9/2006 | Wang et al. | |
| 2012/0081046 A1 | 4/2012 | Dai et al. | |
| 2013/0113401 A1 * | 5/2013 | Ogawa | H02P 6/16 318/400.19 |
| 2016/0226415 A1 | 8/2016 | Yamaguchi et al. | |

* cited by examiner

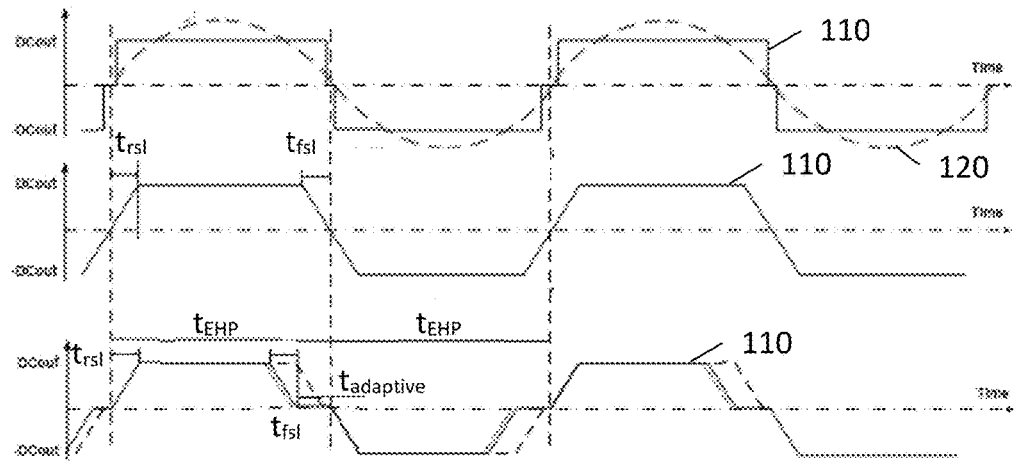
FIG. 2(B)
FIG. 2(C)
FIG. 2(E)
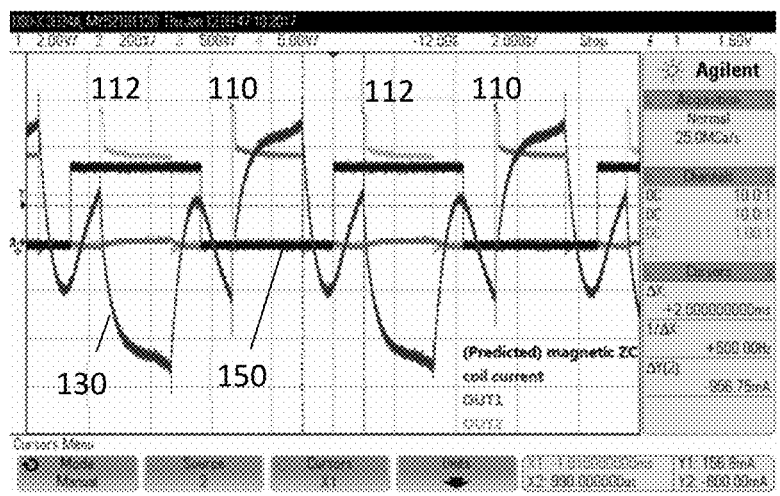
FIG. 3

SENSORLESS BDLC CONTROL

FIELD OF THE INVENTION

The present invention relates to methods and systems for controlling a single-coil brushless DC motor. More specifically it relates to sensorless control of brushless DC motors.

BACKGROUND OF THE INVENTION

Brushless DC motors typically comprise a magnetic rotor and one or more stator coils. For driving the rotor by applying a suitable driving current waveform to one or more stator coils it is important to know the rotor position in relation to the stator coils. In function of this position the driver generates a current in a specific direction through a specific coil to generate torque so as to turn the rotor in a desired direction. When the rotor has turned beyond a certain position, (the commutation point), the current direction needs to be varied (commutated) so that it is again in the appropriate direction to generate torque in the desired direction.

Methods and systems for controlling the commutation of a brushless DC motor may be based on Hall sensors. These Hall sensor(s) detect the position of the rotor in relation to the stator coils and based thereon the current through the motor coils(s) is controlled.

In order to avoid the need for a Hall sensor, sensorless commutation methods are developed. Such sensorless methods may for example monitor the BEMF voltage for estimating the position of the rotor. Sensorless methods make the motor construction less complex, because the hall sensor position is critical for the operation of Hall based commutation.

In low cost high volume fan systems such as they are used for CPU cooling, refrigerator ventilation, power converter cooling etcetera, single coil fans, based on hall sensing are applied. In case in such low cost systems the hall sensor could be avoided, it is clear that the fandriver may no longer have to be applied close to the rotor, or even not inside the fan anymore. In current low cost systems remote controllers typically use PWM input signals, and FG/RD communication interface pins to control the fandrivers which are integrated into the remote fan. In case of sensorless control, a significant system simplification can be achieved by locating the fandriver close to the controller, or even integrate into the remote controller.

Another problem is that the BEMF voltage can only be measured correctly, if there is no current flowing in the coil. For this purpose, a window with no current in the coil must be created in the driving wave form profile. This might introduce a torque ripple in the torque generated by the motor, audible or EMC noise.

For example, a single-coil brushless DC motor is described in U. S. Patent Application Publication 2006/0214611 and discloses a method and circuit for controlling a sensorless single-phase DC motor that measure the back emf of the winding. In this approach, a rotor position is determined based on the back-emf by stopping the supply current and, after the current has decayed the back emf is measured.

In an alternative design disclosed in U.S. Pat. No. 9,515,588, a method of controlling a brushless permanent-magnet motor includes generating a voltage proportional to a winding voltage and generating a second signal differentiated with the first to generate a third signal that is compared to the first to create an output signal having an edge corresponding to a coincidence between the first and third signals.

In three phase brushless DC (BLDC) motors, a well-known first commutation strategy, referred to as trapezoidal control is to monitor the BEMF voltage zero crossing in the third coil which is not driven, while driving the first and second coil.

In one example design, EP 1612925 describes a synchronous acceleration control method comprising performing a phase commutation of phase current at a phase commutation time point (t0) while the BLDC motor is synchronously accelerated, detecting a phase current applying time point (t1) when a magnitude of phase current supplied to the BLDC motor exceeds a predetermined value (TH1), and controlling a voltage applying time point when voltage is applied to stator windings with respect to a rotation position of a rotator based on a transient current detection time $\delta t$ between the phase commutation time point (t0) and the phase current applying time point (t1), so that the phase current is not excessively large.

U.S. Pat. No. 9,602,032 detects rotor position based on impedance measurements and EP 2037567B1 detects rotor position based on BEMF. In more advanced three phase BLDC control strategies, referred to as sinewave strategies, the commutation is defined while all three coils are driven. There exist methods wherein at predefined moments every 60 degree of multiple of 60 degree, the rotor position is defined. In other methods, the current is continuously monitored. These methods are referred to as Field Orient Control (FOC).

As the methods get more complex, the needed calculation increases drastically. For FOC control 8-bit, 16 bit and even 32 bit CPUs are applied. Also the performance of these methods is strongly depending on the motor magnetic design, which is preferably delivering constant torque by the application of constant current. Otherwise the drive has to compensate such motor deficiencies, leading to further drive complexity.

In all sinewave methods, the essential part is to smoothly transfer the torque vector from one coil to the next with minimum torque ripple. In single-coil BLDC control, such smooth transfer is not possible, because the torque has to go through zero at the point where rotor north pole transits to a south pole.

In a single-coil motor the trapezoidal method cannot be applied because there is no undriven coil, also FOC methods are not obvious because of the strong non-linear nature of the single-coil fan torque every 180 electrical degrees.

There is therefore room for improvement for driving single-coil brushless DC motors in a sensorless way.

SUMMARY OF THE INVENTION

It is an object of embodiments of the present invention to provide a good system and method for driving a single-coil BLDC motor.

The above objective is accomplished by a method and device according to the present invention.

In a first aspect embodiments of the present invention relate to a method 800 for controlling a single-coil brushless DC motor, the method comprises:
monitoring a signal indicative of a time derivative of a phase current through the coil of the brushless DC motor during at least one commutation cycle, determining a first moment of the at least one commutation cycle such that at the first moment the absolute value of the time derivative of the phase current is smaller than or equal to a slope threshold, determining a rising edge of a driving signal in a commutation cycle, based on the first moment of that commutation cycle and/or based on the first moment of at least one earlier commutation cycle, and/or determining a falling edge of the driving signal in that commutation cycle based on the first moment of at least one earlier commutation cycle, driving the single-coil brushless DC motor using the driving signal defined in the determining step.

It is an advantage of embodiments of the present invention that it is possible to determine the rising edge and/or the falling edge of the driving signal without the need for a hall sensor (i.e. in a so called sensorless way) based on measuring the phase current.

One specific parameter which is used therefore is the first moment of a commutation cycle. This first moment is detected and registered when the absolute value of the time derivative of the phase current is smaller than or equal to a slope threshold (diph/dt_th). This slope threshold may be adjustable. It is an advantage of embodiments of the present invention that this first moment (Tzc) is indicative of the back EMF zero crossing.

In embodiments of the present invention the signal indicative of the time derivative of the phase current is monitored when the absolute value of the time derivative of the phase current is decreasing.

In embodiments of the present invention the rising edge of the driving signal, in the commutation cycle, is determined at least based on the first moment in at least one earlier commutation cycle.

It is an advantage of embodiments of the present invention that they allow adaptive control of the driving signal based on measurements of the signal indicative of the time derivative of the phase current of previous commutations.

In embodiments of the present invention the rising edge of the driving signal in a commutation cycle is based on the first moment in that commutation cycle and on the first moment in at least one earlier commutation cycle.

In embodiments of the present invention monitoring of the signal indicative of the time derivative of the phase current through the coil of the brushless DC motor is started when the absolute value of the phase current is reduced below a sensor threshold, or when the driving signal has an average voltage difference over the coil below a driving threshold, or at a predefined time or angular position after the start of the falling edge, or after the end of the falling edge.

It is an advantage of embodiments of the present invention that the time window for monitoring the signal indicative of the time derivative of the phase current can be reduced to a period with an increased signal to noise ratio. In embodiments of the present invention the predefined time, angular position or phase current indicative threshold may be adjusted, for instance on the bases of a phase or supply current measurement or duty cycle value or speed information, using look up tables or through closed loop or open loop regulation, or any combination.

In embodiments of the present invention monitoring the signal indicative of the time derivative of the phase current is stopped when the absolute value of the time derivative of the phase current drops below the slope threshold or at a predefined time out value or angular value after starting the monitoring.

In embodiments of the present invention determining the rising edge of a driving signal comprises determining a start moment of the rising edge and/or a shape of the rising edge and wherein determining the falling edge of a driving signal comprises determining a start moment of the falling edge and/or a shape of the falling edge.

It is an advantage of embodiments of the present invention that it is possible to determine the start moment of the rising edge of the driving signal (the commutation point) and/or the stop moment of the falling edge of the driving signal without the need for a hall sensor (i.e. in a so called sensorless way) based on measuring the phase current. It is an advantage of embodiments of the present invention that also the shape of the rising edge and/or falling edge can be determined in a sensorless way.

In embodiments of the present invention the falling edge of the driving signal in a commutation cycle is determined such that the absolute value of the phase current is reduced below a switch threshold at a second moment such that the second moment is before the rising edge of the driving signal in the commutation cycle and/or before the first moment of the commutation cycle.

It is an advantage of embodiments of the present invention that the signal to noise ratio for the time derivative of the phase current is increased.

It is an advantage of embodiments of the present invention that the absolute value of the current is reduced below the switch threshold before starting to drive the single-coil BLDC motor in the following electrical half period. This enables a smoother operation of the single-coil BLDC motor than when the absolute value of the phase current cannot yet reduce below the switch threshold before starting the rising edge of the driving signal in the commutation cycle.

In embodiments of the present invention the start moment of the falling edge of the driving signal in a commutation cycle is determined such that the absolute value of the phase current is reduced below a switch threshold at a second moment such that the second moment is before the start moment of the rising edge of the driving signal in the commutation cycle.

It is an advantage of embodiments of the present invention that by adjusting the start moment of the falling edge based on current measurements from previous commutation cycles it is possible to reduce the length of the flat period (the undriven period) of the driving signal, and thereby minimize the noise, and avoid loss of torque.

It is an advantage of embodiments of the present invention that the falling edge of the driving signal is determined such that the absolute value of the phase current is reduced below the switch threshold before the first moment as a low phase current enables a more accurate determination of the phase current.

In embodiments of the present invention the rising edge of the driving signal for the next commutation cycle is determined based on the first moment and/or the second moment of the at least one earlier commutation cycle.

It is an advantage of embodiments of the present invention that the rising edge of the driving signal is determined in function of the second moment at which a low phase current is reached. This allows to commutate at low phase currents thus reducing the noise of the single-coil BLDC motor. In embodiments of the present invention the second moment is used to determine the start moment of the rising edge of the driving signal in a next commutation cycle.

In embodiments of the present invention the phase current is monitored when the absolute value of the time derivative of the phase current is decreasing and wherein the slope threshold is increased with an increasing speed of the single-coil brushless DC motor and/or an increasing absolute value of the average phase current.

It is an advantage of embodiments of the present invention that the lead angle on the rising edge of the driving signal can be increased at increased motor speeds, and/or increased phase currents.

In a second aspect embodiments of the present invention relate to a system for controlling a single-coil brushless DC motor. The system comprises:
a current sensor configured for monitoring a signal indicative of a time derivative of a phase current through the coil of the brushless DC motor during at least one commutation cycle,
a comparator configured for determining a first moment of the at least one commutation cycle when the absolute value of the time derivative of the phase current is smaller than or equal to a slope threshold,
a controller configured for determining a rising edge of a driving signal in a commutation cycle, based on the first moment of that commutation cycle and/or based on the first moment of at least one earlier commutation cycle, and/or determining a falling edge of the driving signal in that commutation cycle based on the first moment of at least one earlier commutation cycle wherein the driving signal is suitable for driving the single-coil brushless DC motor,
a driver configured for driving the single-coil brushless DC motor using the driving signal determined by the controller.

In embodiments of the present invention the driving signal is a pulse-width modulation signal or a linear controlled signal. The system may be adapted for determining the slope threshold such that it increases with an increasing duty cycle of the PWM input signal.

In embodiments of the present invention the controller is configured for determining the rising edge of the driving signal in a commutation cycle, at least based on the first moment in at least one earlier commutation cycle.

In embodiments of the present invention the current sensor is configured for monitoring the signal indicative of the time derivative of the phase current through the coil of the brushless DC motor when the absolute value of the phase current is reduced below a sensor threshold, or when the driving signal has an average voltage difference over the coil below a driving threshold, or at a predefined time or angular position after the start of the falling edge, or after the end of the falling edge.

In embodiments of the present invention the controller is configured for determining the falling edge of the driving signal in a commutation cycle such that the absolute value of the phase current is reduced below a switch threshold at a second moment such that the second moment is before the rising edge of the driving signal, and/or before the first moment in the commutation cycle.

In embodiments of the present invention the controller is configured for determining the rising edge of the driving signal for the next commutation cycle based on the first moment and/or the second moment of the at least one earlier commutation cycle.

In a third aspect embodiments of the present invention relate to a motor device which comprises a single-coil brushless DC motor and a system for driving the brushless DC motor in accordance with embodiments of the present invention.

In a fourth aspect embodiments of the present invention relate to a method of operating a motor device according to embodiments of the present invention. The method comprises providing the motor device; and providing electrical power to the motor device to cause the single coil brushless DC motor to rotate.

It is an advantage of embodiments of the present invention that it is sufficient to power the motor device for causing the single coil brushless DC motor to rotate. The reason therefore being that the motor device comprises a system for controlling the single coil brushless DC motor in accordance with embodiments of the present invention.

In a fifth aspect embodiments of the present invention relate to a method of making a system for controlling a single coil brushless DC motor. The method comprises providing a current sensor configured for monitoring a signal indicative of a time derivative of a phase current through the coil of a single-coil brushless DC motor during at least one commutation cycle; providing a comparator configured for determining a first moment of the at least one commutation cycle when the absolute value of the time derivative of the phase current is smaller than or equal to a slope threshold; providing a controller configured for determining a rising edge of a driving signal in a commutation cycle, based on the first moment of that commutation cycle and/or based on the first moment of at least one earlier commutation cycle, and/or determining a falling edge of the driving signal in that commutation cycle based on the first moment of at least one earlier commutation cycle wherein the driving signal is suitable for driving the single-coil brushless DC motor; providing a driver configured for driving the single-coil brushless DC motor using the driving signal determined by the controller; and electrically connecting the current sensor to the comparator and electrically connecting the controller to the driver.

In a sixth aspect embodiments of the present invention relate to a method of making a motor device. The method comprises: providing a system in accordance with embodiments of the present invention; providing a single-coil brushless DC motor; and electrically connecting the single-coil brushless DC motor to the system. In embodiments of the present invention the system is provided by making it using a method according to embodiments of the present invention.

In a seventh aspect embodiments of the present invention relate to a motorized system which comprises a motor device according to embodiments of the present invention wherein the motor device comprises a rotor having a shaft; and wherein a mechanical load is attached to the shaft. Such a load may for example be a fan.

In an eight aspect embodiments of the present invention relate to a method of operating a motorized system according to embodiments of the present invention. The method comprises providing a motorized system according to embodiments of the present invention; providing electrical power to the motor device to cause the mechanical load to rotate.

In a ninth aspect embodiments of the present invention relate to a method of making a motorized system in accordance with embodiments of the present invention. The method comprises: providing a motor device according to embodiments of the present invention, the motor device comprising a rotor having a shaft; providing a rotating mechanical load attached to the shaft; and attaching the rotating mechanical load to the shaft.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIGS. 2(B), 2(C), and 2(E) show traces of the driving signals and parameters thereof which can be controlled using methods in accordance with embodiments of the present invention.

FIG. 3 shows a plot of a driving signal, a hall sensor based commutation signal, and the driving signal of a single-coil brushless DC motor.

Figure 1A:
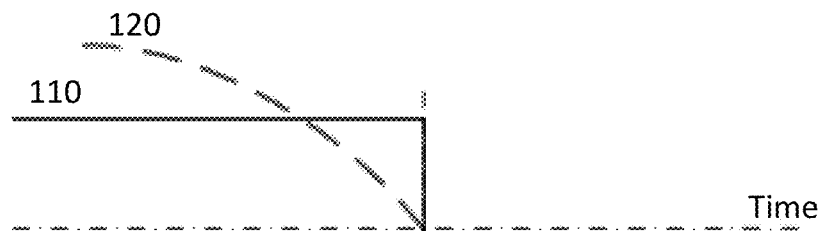
FIGS. 1(A) to 1(E) show possible driving signals for driving a single-coil brushless DC motor.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to the driving signal, reference is made to the signal which generates a current through the motor coil of the single-coil BLDC motor. The current may be generated by an average voltage difference over the motor coil generated by the full bridge output driver. The driving signal may be a pulse width modulated (PWM) signal, or a linear controlled signal.

The average voltage difference is just a means to produce the phase current in the single-coil BLDC motor.

The average voltage difference across the motor coil in case of an embodiment with supply VDD, may be anywhere between 0V and VDD. The current scales up accordingly.

In a PWM driving method, the voltage is provided with a time interrupted way resulting in an average voltage difference over the coil. When neglecting resistive losses in the bridge driver and the motor coil of the single-coil BLDC motor, the average voltage difference is 12V when driving the motor with a supply voltage VDD=12V and a DCout=100% PWM. With e.g. a DCout=50% PWM driving signal the average voltage difference is 6V over the coils. Also, when applying the PWM driving method the phase current scales up accordingly, and can be represented as Iphase=(VDD*DCout−BEMF)/Z, in which Z is the impedance of the bridge driver and the motor coil, and in which BEMF is the Back Electromotive Force induced into the coil by the rotating permanent magnets on the rotor.

In a linear driving method, the average voltage difference is realized by adjusting the resistive losses in the bridge driver, and by dissipating the excess energy in the bridge driver.

The current in the coil determines the torque that the single-coil BLDC motor provides. Depending on the mechanical load of the motor, in an open loop controlled system the torque will develop to a given speed. In a closed loop system the regulation loop will adjust the motor torque in order to reach or maintain a target speed.

Independent of the driving signal with a given voltage difference over the coil and resulting current in the coil, in brushless DC motors, the motor must be commutated depending on the position of the rotor. In single-coil BLDC motors the current direction in the single-coil must change its polarity under the use of a commutation method.

When driving a single-coil motor using a driving signal, the driving signal may be subdivided into electrical half periods (EHP). Where in embodiments of the present invention reference is made to an electrical half period, reference is made to a period of 180 electrical degrees, which is starting at the start of the rising slope of a driving signal, and ends at the start of the rising slope of the next driving signal.

Where in embodiments of the present invention reference is made to one commutation cycle, reference is made to the time period between starting of the falling slope of one EHP, until the end of the rising slope of the next EHP.

Where in embodiments of the present invention reference is made to the falling edge of a driving signal in a commutation cycle, reference is made to the period when the driving signal changes from a signal which generates a current through the coil to a signal which does not generate anymore a current through the coil (e.g. the voltage or average voltage over the coil changes from a positive or a negative voltage to zero voltage).

Where in embodiments of the present invention reference is made to the rising edge of a driving signal in a commutation cycle, reference is made to the period, when the driving signal changes from a signal which does not generate a current through the coil to a signal which generates a current through the coil (e.g. the voltage or average voltage over the coil changes from zero voltage to a positive or a negative voltage).

Where in embodiments of the present invention reference is made to the BEMF ZC, reference is made to the back-EMF voltage zero crossing.

In a first aspect embodiments of the present invention relate to a method for controlling a single-coil brushless DC motor which is driven using a commutating driving signal.

In methods according to embodiments of the present invention the driving signal is adaptively controlled based on current measurements of previous commutations.

Therefore such a method 800 comprises a step for monitoring 810 a signal indicative of a time derivative of a phase current through the coil of the single-coil brushless DC motor during at least one commutation cycle. This may for example be in a period, when the absolute value of the time derivative of the phase current is decreasing. Monitoring of the signal indicative of the time derivative $di_{ph}/dt$ of the current through the coil may for example be achieved by doing subsequent current measurements and by calculating the signal indicative of the time derivative from these subsequent measurements. This signal may be the time derivative of the current itself. Alternative methods could be to use at least two comparators with different levels, or equivalent circuitry, and use the time between triggering of the subsequent comparators as indication of the time derivative. Alternative methods for monitoring the signal indicative of the time derivative of the phase current are explained further in the description.

The method, moreover, comprises a step for determining 820 a first moment of at least one commutation cycle. At this first moment, the absolute value of the time derivative of the phase current is smaller than or equal to a slope threshold.

The method moreover comprises a step for determining 830 a rising edge of a driving signal in a commutation cycle based on the first moment of that commutation cycle and/or based on the first moment of at least one earlier commutation cycle, and/or for determining 830 a falling edge of the driving signal in that commutation cycle based on the first moment of at least one earlier commutation cycle.

In embodiments of the present invention this may imply determining a start moment of a rising edge of the driving signal and/or a start moment of a falling edge of the driving signal in a later commutation cycle. This may also imply determining the shapes of the rising and falling edges of the driving signal.

In embodiments of the present invention determining the rising edge of the driving signal in a commutation cycle may be based on the first moment in at least one earlier commutation cycle.

In embodiments of the present invention, the start moment of the rising edge of the driving signal may also be referred to as the rising time moment (Tr). Similarly, the start moment of the falling edge of the driving signal may be referred to as the falling time moment (Tf). This is the moment at which the voltage over the coil starts decreasing.

The method, moreover, comprises a step for driving 840 the single-coil BLDC motor using the driving signal defined in the determining step 830.

Using such a method the driving of the single-coil BLDC motor can be adaptively controlled by monitoring the time derivative of the current from previous commutation cycles.

FIGS. 1(A) to 1(E) show possible driving signals for driving such a single-coil BLDC motor. In its simplest form the output bridge driver can commute the driving signal 110 (e.g. voltage wave) exactly on the back-EMF voltage 120 zero crossing, this is referred to as hard commutation and is shown in FIG. 1(A). In that case, the falling edge of a driving signal in one commutation cycle starts at the same moment as the rising edge of the driving signal in that commutation cycle, wherein the falling edge has an inverted polarity compared to the rising edge.

Figure 1B:
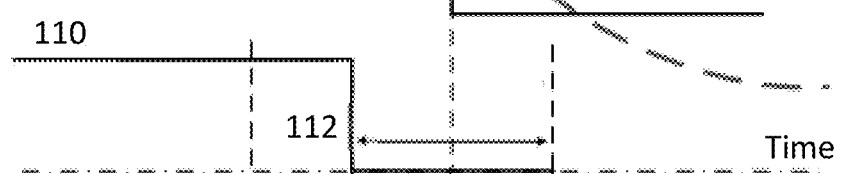
Figure 1C:
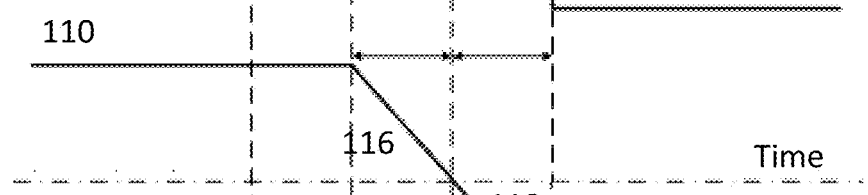

However, due to delay in response of the current in the coil, and because the BEMF voltage is also not changing its polarity instantaneously, such simple commutation leads to reduced efficiency, reverse current and increased noise. In practice, as shown in FIG. 1(B), a minimum time window 113 is applied between the start of the falling edge in one EHP, and the start of the rising edge of the driving signal 110 (e.g. voltage wave) in the next EHP.

In embodiments of the present invention the falling edge and the rising edge may have different shapes. The falling edge 112, and the following rising edge 114 of the driving signal can be realized as instantaneous, abrupt changes of the output duty cycle from DCout (the resulting applied voltage on the coil is DCout x VDD wherein VDD is the voltage from a power supply) to 0%, and from 0% to DCout respectively, with a so called flat period 113 in between where DCout=0%. An example thereof is illustrated in FIG. 1(B).

In embodiments of the present invention the shape of the falling edge or rising edge may be a sloped shape, possibly combined with a flat period. By realizing the transitions of the driving signal in a more gradual way the acoustic noise can be further improved. FIG. 1© shows a so called Slope-Slope switching which uses 2 slope shapes 116, 118 for rising and falling slope of subsequent driving signals. Such slopes may be regulated to be ¹⁄₁₆ of an electrical half period (EHP).

Figure 1D:
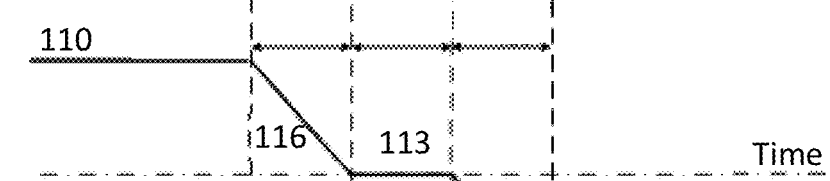

For higher current levels, and higher motor speeds, the shape of the falling edge and/or rising edge may take more complex variations, and may comprise an additional flat portion 113 which further allows the coil current the time to decay, as shown in FIG. 1(D), realizing a Slope-Flat-Slope (116-113-118) switching.

Figure 1E:
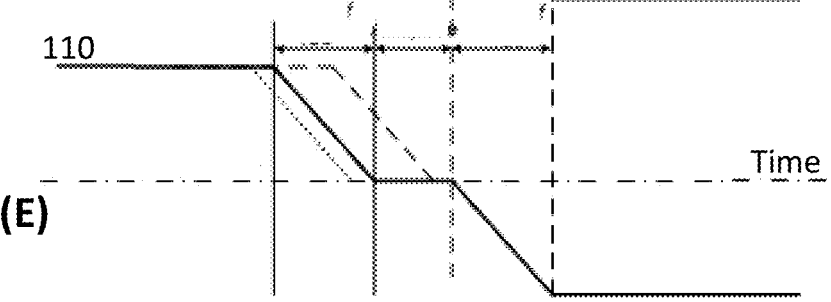

Such additional flat may, however, cause additional noise at lower speeds and/or lower current levels. In embodiments of the present invention the flat portion 113 is adjusted by adaptive control, based on current measurements during previous commutations, to be just long enough to allow the current to decay to an acceptable level prior to starting the rising slope. An advantage thereof is that the torque can be maximized, and the acoustic noise can be reduced by minimizing the duration of the flat portion. Such implementation is shown in FIG. 1(E).

Traces of the driving signal are shown in FIGS. 2(B), 2(C) and 2(E) for a flat driving signal 110 (voltage switching waveform) in FIG. 2(B), for a slope driving signal in FIG. 2(C) and for an adaptive slope driving signal 110 in FIG. 2(E). FIG. 2(B) also shows the BEMF voltage 120. The duration of one electrical half period is indicated in FIG. 2(E) and is indicated by tEHP. The voltage switching waveform is in this example varying between +DCout and −DCout. In FIG. 2(C) and FIG. 2(E) the voltage is rising during a period $t_{rs1}$ and the voltage is falling during a period $t_{fs1}$. In embodiments of the present invention the start moment at which to start driving the single-coil BLDC motor and the stop moment at which to stop driving the single-coil BLDC motor is adjustable. In FIG. 2(E) this is indicated by the period $t_{adaptive}$.

It is known in the state of the art that for optimal alignment of the current through the coil to the back-EMF voltage shape, the start moment of the rising edge of the driving signal should be aligned with the back-EMF voltage zero crossing (ZC).

In case of rotor position sensing with a hall sensor this implies accurate positioning of the hall sensor, such that the commutation of the hall sensor output is aligned with the BEMF ZC, or that a correction is applied on the timing output to adjust for the error. However, to start the falling edge at the optimal point before the BEMF ZC, and hence before the hall sensor commutation, additional intelligence should be generated. This can be done in a predictive analog way, for instance using adaptive gain control of the analog hall sensor output.

In embodiments of the present invention this may be achieved through predictive driving, in which the start of the falling edge and/or the start of the rising edge is defined based on the timing information from previous commutations.

Figure 6:
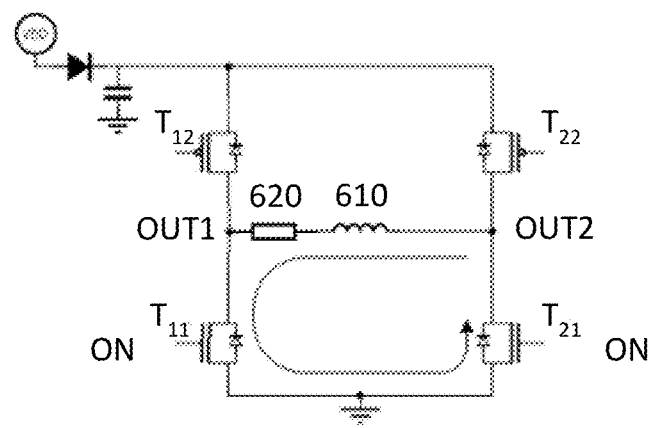
FIG. 6 shows a schematic drawing of single-coil BLDC motor which can be driven following the steps of a method in accordance with embodiments of the present invention.

Examples of such methods for adaptively controlling the falling edges and/or rising edges of the driving signal for a brushless DC motor are explained in the following paragraphs. An example of an electrical scheme of such a motor comprising a full bridge driver (T11, T12, T21, T22) is shown in FIG. 6. FIG. 6 also shows the motor coil 610. The terminals of the coil are OUT1 and OUT2. In this example, the driving signal during one commutation cycle is applied on OUT1, and during the following commutation cycle it is applied on OUT2.

FIG. 3 shows the traces of the driving signal 110 at OUT1, of the driving signal 112 at OUT2, of a hall sensor based commutation signal 150 which is aligned with the back EMF, and of the current 130 through the coil. The Hall sensor based commutation signal is also referred to as FG. As can be seen from this plot, the BEMF zero crossing coincides with the moment when the derivative of the phase current ($di_{ph}$/dt) becomes about zero. For this plot the falling edge of the driving signal 110, 112 was on purpose started too soon, and the rising edge of the driving signal 110, 112 started too late. A flat period with a duty cycle DCout of 0% corresponding with an applied voltage of VDD×DCout=0 is present when both are zero.

In embodiments of the present invention the shape of driving signal may comprise a falling edge 112, 116, a rising edge 114, 118, and a flat period 113. The first moment is defined as the moment when the time derivative of the phase current equals or is smaller than a predefined threshold and can be determined by monitoring the phase current. In embodiments of the present invention the commutation timing may be defined based on at least two successive first moments.

Figure 4:
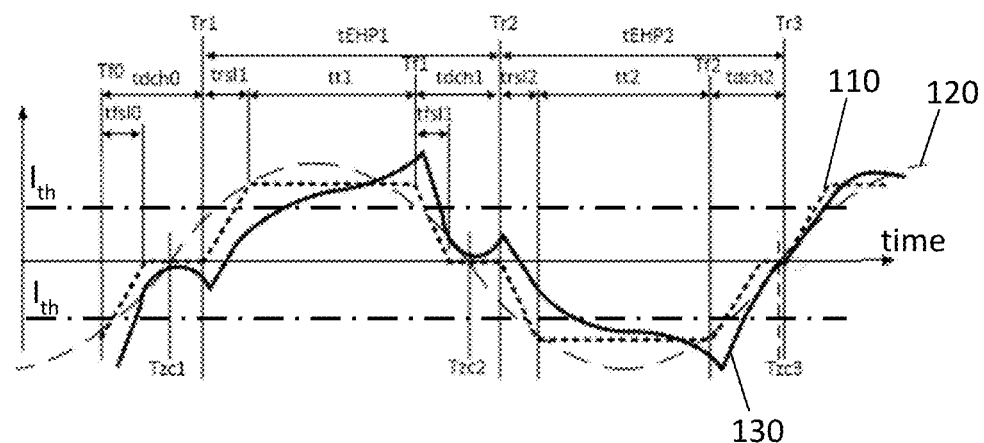
FIG. 4 illustrates different moments in the commutation cycle of a single-coil brushless DC motor, when driven in accordance with embodiments of the present invention.

In FIG. 4 different moments in the commutation cycle of a single-coil brushless DC motor, when driven in accordance with embodiments of the present invention, are shown. The figure shows three commutations and two electrical half periods (the time duration of these two electrical half periods is tEHP1 and tEHP2). The figure shows the driving signal 110, the BEMF voltage 120, and the phase current 130 in function of time.

In the following enumeration, the moments and periods for the first electrical half period are discussed. These can be extrapolated to the following electrical half periods. In this simplified example an energization in 3 stages is considered:

The start moment of the first electrical half period is indicated by Tr1. It corresponds with the moment at which the driving signal 110 is rising and starts driving the single-coil BLDC motor (i.e. the start moment of the rising edge).

The period during which the driving signal 110 (in this example DCout which is the output duty cycle) is increasing is indicated by trsl1.

The period during which the driving signal 110 (DCout) is kept at a constant maximum value is indicated by tt1. This period is also referred to as the torque period.

The period during which the driving signal 110 (DCout) is decreasing, starts at Tf1 and is indicated by tfsl1. This period may be followed by an undriven period during which no driving signal is applied (DCout=0%). The decreasing period and the undriven period together are referred to as the discharging period tdchl (or the falling edge of the driving signal). This period allows the current to discharge from the coil.

The end moment of the first electrical half period corresponds with the start of the second electrical half period Tr2. In general each electrical half period EHPx starts at Trx, the start of the rising slope of the driving signal, and ends and Tr(x+1), the start of the next rising slope.

In this graph in the first 2 commutation cycles the rising edge of the driving signal starts later than the moment at which the induced BEMF voltage by the rotor into the coil is zero (Tzc1 and Tzc2), this is referred to as lag angle. The third commutation shows a more optimal start of the rising edge of the driving signal, very close to the BEMF ZC (Tzc3). This improved operation is achieved by applying a method in accordance with embodiments of the present invention wherein the start moment of the falling edge and/or the start moment of the rising edge of the driving signal is adjusted based on current measurements of actual and/or previous commutation cycles.

In embodiments of the present invention the rising edge and/or the falling edge may be adjusted every electrical half period (EHP), every multiple EHP or even within one EHP and this based on previous current measurements.

In embodiments of the present invention the start moment (Tfx) of the falling edge of the driving signal is determined such that the absolute value of the phase current is below a switch threshold value (Ith) before the start moment of the rising edge of the driving signal of the next electrical half period (Trx+1). The moment the absolute value of the phase current becomes below the switch threshold is also referred to as the second moment of a commutation cycle. The switch threshold may for example be a fraction of Ipeak, wherein the peak current Ipeak may be defined as the phase current at the moment or just before the falling edge is initiated, or as the peak current obtained throughout the last EHP. For instance Ipeak/10 or Ipeak/100, or a fixed value which can be defined as a fraction of Imax wherein Imax is the maximum current through the coil, for instance Imax/100.

The current shape will be significantly influenced by the BEMF voltage as long as the BEMF voltage>DCout*VDD. During the discharging period, the current discharges from the coil. This period starts with a period that the driving signal 110 (DCout) is decreasing. At a certain moment in time the driving signal DCout(t) and the discharge current Iph(t) are so small, that the BEMF at that time t largely controls the shape of the current, according to the following equation (Z is the motor impedance):

$$Iph(t)=(DCout(t)*VDD-BEMF(t))/Z$$

Above a minimum speed threshold, the BEMF is large enough such that the coil current is reflecting the integral of the induced BEMF voltage. Consequently, at this moment of small enough current and small enough DCout, and of large enough speed, the moment that $di_{ph}/dt=0$ corresponds with the zero crossing moment (Tzcx) of the BEMF.

In embodiments of the present invention the start moment of the rising edge of the driving signal is determined at the first moment of the previous commutation cycle or shortly thereafter.

This could be less than 45 electrical degrees, or less than 30 electrical degrees or less than 20 electrical degrees, or less than 10 electrical degrees, or less than 5 electrical degrees, or even less than 1 electrical degree thereafter.

In the following exemplary embodiments of the present invention three consecutive electrical half periods (1, 2, 3) in a sequence of electrical half periods are considered. The index numbers of the moments are corresponding with the electrical half period they belong to. The commutation cycles are the time periods between starting of the falling slope of one EHP, until the end of the rising slope of the next EHP (e.g. the second commutation cycle is from the first EHP to the second EHP).

The start moment (Tr2) of the rising edge of the driving signal and the start moment (Tf1) of the falling edge of the driving signal of the second commutation cycle are, in this example, based on the first and the second moment of the first commutation cycle and are used to predict the start time (Tr3) of the rising edge of the driving signal in the third commutation cycle.

The start moment (Tf1) of the falling edge of the driving signal of the second commutation cycle is determined such that when stopping driving the motor at this moment the absolute value of the phase current is reduced below a switch threshold (Ith) before the start moment (Tr2) of the driving signal in the second commutation cycle.

The start moment of the rising edge in the second commutation cycle (Tr2) may correspond with the first moment of this commutation cycle. If, however, $di_{ph}/dt$ has already passed the zero point, when starting to monitor $di_{ph}/dt$, the start moment may be the moment when the increase is detected.

In embodiments of the present invention the signal indicative of the time derivative of the phase current is monitored during a freewheeling state of the bridge driver. This can be during a flat with DCout=0% (the motor is undriven).

As stated before the first moment (Tzc) is indicative of the back EMF zero crossing. In certain cases, the inductive effect due to coil inductance may result in a lag of the moment $dI_{ph}/dt=0$ compared to the actual zero crossing moment (Tzcx) of the BEMF. In embodiments of the present invention this lag may be compensated for by increasing the slope threshold as will be described in the next paragraph.

Figure 5:
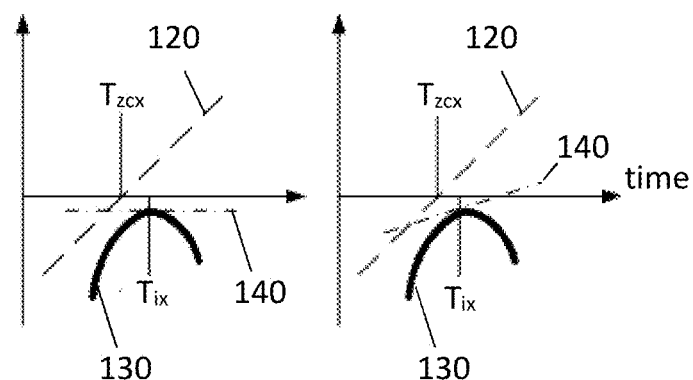
FIG. 5 shows the BEMF voltage and the phase current in function of time and illustrate the use of the slope threshold in accordance with embodiments of the present invention.

The graphs in FIG. 5 show the BEMF voltage 120 and the phase current 130 in function of time. Only that period is shown, which is concentrated around the zero crossing moment of the BEMF. The left and the right graph also show the gradient 140 of the phase current at a certain moment. The left graph shows the gradient 140 when $dI_{ph}/dt=0$, the right graph shows the gradient when the absolute value of $dI_{ph}/dt$ is smaller than or equal to a slope threshold (dItr). In embodiments of the present invention the moment when the absolute value $dI_{ph}/dt$ becomes smaller than or equal to the slope threshold is chosen as the first moment.

FIG. 6 shows a schematic drawing of single-coil BLDC motor which can be driven following the steps of a method in accordance with embodiments of the present invention. The current through the coil can be controlled using a bridge driver comprising transistors T11, T12, T21, T22. The figure also shows a reverse polarity protection diode is applied, and a decoupling capacitor. The configuration shown in FIG. 6 is one possible configuration of the single-coil BLDC motor and its driving circuitry. Methods according to embodiments of the present invention are, however, not limited to be applied only to this configuration. In this example, a recirculating current is flowing during an undriven period (DCout=0%, freewheeling). In this example T11 is permanently on, and DCout is applied on OUT2. Mind that OUT2 can also be OFF, in that case the current will flow through the body diode of T21.

In embodiments of the present invention the phase current (Iph) may for example be monitored by measuring during the active mode of the PWM, in which a high side and a low side transistor on opposite sides of the coil are ON. Several alternatives exist. The phase current may for example also be monitored during freewheeling over the low side or over the high side transistors, or even during the dead time (also called interlock delay) and the freewheeling.

The phase current may for example be measured using a shunt, in series with the coil (620), or by using the Drain-Source-Resistance of the driving transistors as shunt, as sense FET, or using the body diode of the driving transistor, if the transistor is not switched on. In embodiments of the present invention the phase current may be monitored during a phase wherein DCout=0%. The advantage thereof is that in that case no switching can disturb the phase current monitoring. This increases the accuracy and resolution of the phase current monitoring.

In embodiments of the present invention the driving signal is a pulse width modulated signal comprising ON and OFF periods.

The signal indicative of the time derivative of the phase current may be monitored 810 during the OFF period of the pulse width modulated signal. It is thereby an advantage that it is possible to monitor the phase current while driving the single-coil BLDC motor using a pulse width modulated signal.

In embodiments of the present invention the signal indicative of the time derivative of the phase current is monitored 810 during the ON period of the pulse width modulated signal. Preferably the PWM duty cycle is substantially lower (e.g. at least 50% lower) than the maximum applied DCout when monitoring the phase current during the ON period. In embodiments of the present invention the monitoring may only start when the average voltage difference over the coil is below a driving threshold. In case of a PWM driving signal this may be achieved when the duty cycle is below a duty cycle threshold. The driving signal may for example be modulated such that the average voltage difference over the coil is a ratio of the maximum voltage during the ongoing EHP. For instance, if the maximum driving voltage during the EHP is DCoutmax*VDD, then the driving threshold could be 70%*DCoutmax*VDD, or even 40%*DCoutmax*VDD, or even 10%*DCoutmax*VDD.

It is an advantage of embodiments of the present invention that it allows PWM for controlling the motor speed. This may be done at fixed PWM frequencies, without loss of torque, whilst keeping stable control.

In embodiments of the present invention the single-coil BLDC motor is driven 840 using linear control and the signal indicative of the time derivative of the phase current is monitored while driving the motor at a reduced driving force.

In embodiments of the present invention the slope threshold is increased with an increasing duty cycle of the PWM input signal.

In embodiments of the present invention the FETs (e.g. field effect transistors T11, T12, T21, T22 in FIG. 6) of the bridge for driving the coil are controlled linearly. Measuring the phase current during linear control of the driver FET is preferably done when the drive strength is significantly lower (e.g. Less than 50%) than the maximum drive strength during the previous commutation.

Figure 7:
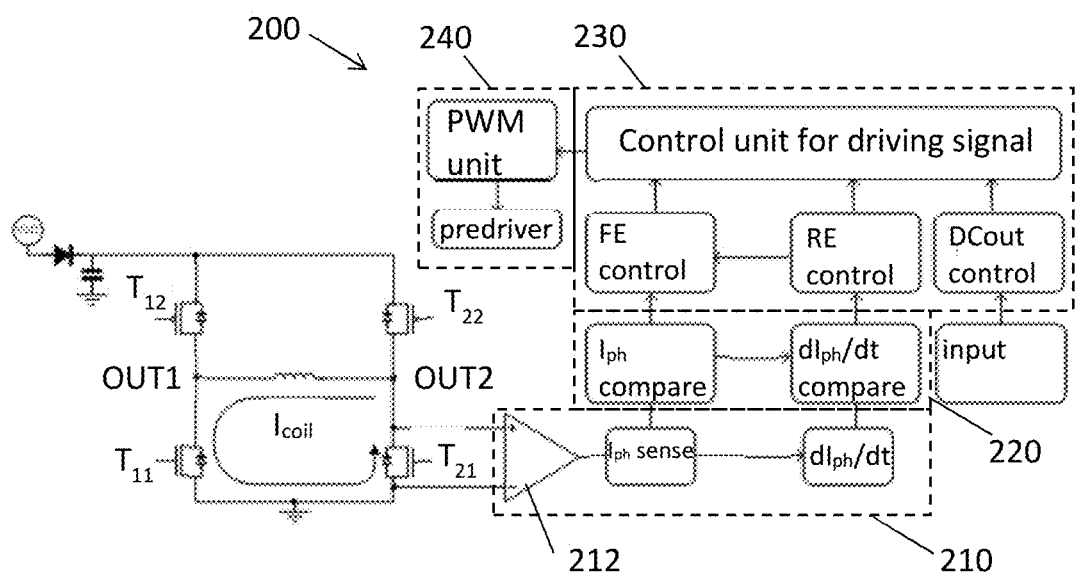
FIG. 7 schematically shows an exemplary embodiment of a system, for controlling a single-coil brushless DC motor, in accordance with embodiments of the present invention.

In a second aspect embodiments of the present invention relate to a system for controlling a single-coil brushless DC motor. FIG. 7 shows an exemplary embodiment of such a system.

In embodiments of the present invention the system comprises a current sensor 210 configured for monitoring a signal indicative of a time derivative of a phase current through the coil of the brushless DC motor during at least one commutation cycle. This may for example be in a period when the absolute value of the time derivative of the phase current is decreasing. The current sensor may for example comprise an amplifier 212 with its input ports connected over a transistor of the bridge driver. A current module (Iph sense) may be connected to output port of the amplifier. This current module may sample a sequence of current samples and pass these to a time derivative module ($dI_{ph}/dt$). The time derivative module is in that case configured for calculating $dI_{ph}/dt$ based on the incoming current samples.

In the example shown in FIG. 7 the current sensor is configured for monitoring the current over the low side transistor T21.

1. During an optional falling slope 116 of the commutation, a phase current flows through T21 from source to drain during freewheeling, i.e. during the OFF period of the duty cycle, resulting in a negative voltage input to differential sensor 212, which may be an amplifier or comparator.
2. During an optional flat portion, the applied duty cycle is 0%, implying that the OFF period equals the full PWM period.
3. During the rising slope of the subsequent EHP, T21 is the active transistor, implying that it remains permanently on. A phase current is flowing through T21 from drain to source, resulting in a positive voltage input to the differential sensor 212.

It is thereby an advantage of embodiments of the present invention that the monitoring of the phase current can be done during any time during the commutation, and with any type of commutation, of which examples are shown in FIGS. 1(A) to 1(E) and FIGS. 2(B), 2(C), and 2(E).

It can be understood that the same can be applied on transistor T11, and can be applied also on transistors T12 and T22, or to any combination of these transistors, for instance use T11 during the falling slope and the Flat portion, and use T21 during the rising slope. Alternatively, a dedicated shunt resistor can be applied as a current sensor. The location of the shunt resistor can be in the freewheeling current path, 620 in FIG. 4, or in the active path between supply and ground.

In this exemplary embodiment of the present invention the current sensor is configured for calculating the time derivative of the phase current based on the measured phase currents. The invention is, however, not limited thereto. Differentiating in time may be done in the analog domain or in the time domain.

The system 200 comprises a comparator 220 configured for determining a first moment of the at least one commutation cycle when the absolute value of the time derivative of the phase current is smaller than or equal to a slope threshold. Such a comparator may be an analog comparator or a digital comparator.

In the analog domain, a capacitor may be introduced to realize an analog delay. A comparator with 2 inputs can then compare the current levels of which one is delayed.

In the digital domain the current sensor is adapted for providing a digital signal. An ADC may be sampling the current and the obtained samples may be processed. Minimum two samples are required to obtain a current slope. However, more may be advantageous to cancel out noise.

In embodiments of the present invention the current may be measured at predefined intervals (dt), or alternatively the time interval (dt) may be measured at predefined current intervals (dI). For instance using comparators with 2 trigger levels, which allow to capture a time.

In preferred embodiments of the present invention the predefined time or current levels can be adaptive to the actual peak current levels. For instance, by measuring the peak current, or using a look up table, and combining the levels to a given DCout.

In embodiments of the present invention a signal indicative of the time derivative of the phase current could for instance be obtained by using a comparator with at least one comparator crossing level. This comparator crossing level may for example be a function of the peak current, and/or a function of duty cycle etc. The comparator crossing level may cut a parabolic current shape at 2 points, the middle of which is indicative of the peak in the phase current, or the $dI_{ph}/dt=0$ point. In a converging mode, and when using two comparator crossing levels these threshold levels may have the same sign. In a stable operating mode, where the current is below a reference threshold, the comparator crossing levels may be of opposite sign. In embodiments of the present invention the comparator crossing level may be the same as the switch threshold which may be used for determining the falling edge of the driving signal.

Figure 15:
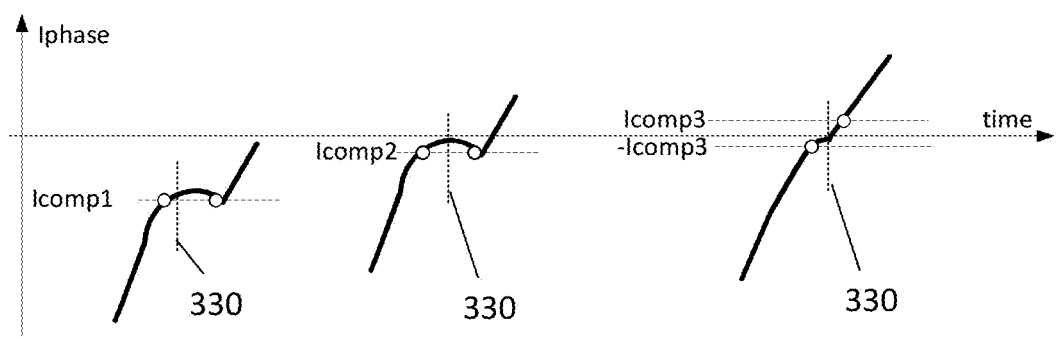
FIG. 15 shows three examples wherein comparator crossing levels of the phase current are used to obtain a signal indicative of the time derivative of the phase current in accordance with embodiments of the present invention.

FIG. 15 show three examples wherein comparator crossing levels of the phase current are used to obtain a signal indicative of the time derivative of the phase current. The vertical dashed lines 330 illustrate the moment of the BEMF zero crossing.

In a first case the phase current is not low enough when the peak value ($dI_{ph}/dt=0$) is reached, because for instance the falling edge was initiate too late compared to the rotor position. In this case the BEMF ZC will fall before the "$dI_{ph}/dt=0$" peak. Comparator crossing level Icomp1 will be triggered twice. The time between the points can be captured by a timer. The timer information, combined with the comparator crossing level provide the necessary input to predict the BEMF ZC in the next zero crossing, and as such converge towards a more optimal starting point of the falling edge in subsequent EHPs.

In the second case the phase current is low enough when the parabolic shape is visible in the phase current, such that the peak position ($dI_{ph}/dt=0$) is indicative of the BEMF ZC. The actual BEMF ZC timing point can for example be estimated as the middle between the two points defined by Icomp2.

In a third case, the comparator crossing levels are opposite in sign. While in previous cases the rising edge of the driving signal may for example only applied after the second comparator crossing is detected, in this third case the rising edge is applied before the second comparator crossing is detected, for instance based on predictive information at which moment the BEMF ZC location should be located. The timing information between the two comparator crossings, and the applied BEMF ZC provide information to predict the next BEMF ZC. In other embodiments, the comparator crossing levels of the two points don't have to have the same absolute value. Other embodiments or combinations of derivative sensing, and indicative signals can be applied.

The system moreover comprises a comparator 220 configured for determining a first moment of at least one commutation cycle such that at the first moment the absolute value of the time derivative of the phase current is smaller than or equal to a slope threshold. The comparator may also be adapted for comparing the phase current with a sensor threshold. The system may in that case be adapted to only start monitoring the time derivative of the phase current when the absolute value of the phase current is reduced below the sensor threshold or when the driving signal has an average voltage difference over the coil below a driving threshold. In this implementation example the comparator only compares the time derivative of the phase current ($di_{ph}/dt$) with the slope threshold when the absolute value of the phase current is below a sensor threshold. Alternatively, also the $di_{ph}/dt$ comparison may be constrained by a predefined time, and/or a predefined number of electrical degrees after the start of the falling edge of the driving signal.

In embodiments of the present invention the driving signal is a pulse-width modulation signal and the system is adapted for determining the slope threshold such that it increases with an increasing duty cycle of the PWM input signal. The relationship between the slope threshold and the duty cycle of the PWM input signal may for example be stored in a table comprising duty cycle values and corresponding slope thresholds, or it may for example be a linear relationship or any other kind of pre-defined relationship.

The system moreover comprises a controller 230 configured for determining a rising edge (RE control) of a driving signal and/or a falling edge (FE control) of the driving signal, in a commutation cycle, based on the at least one first moment of the commutation cycle and/or based on the first moment in at least one earlier commutation cycle wherein the driving signal is suitable for driving the single-coil brushless DC motor. In embodiments of the present invention the shape of the driving signal can be adapted by the controller. This may be done by controlling the shape and the start of the rising edge, the shape and the start of the falling edge time and/or the (average) amplitude of the driving signal. In embodiments of the present invention the driving signal may have a pre-defined wave shape. For example, the rising edge and falling edge may be 1/16 of the electrical half period.

In the exemplary embodiment shown in FIG. 7 the controller is configured for using the first moment (i.e. the time when $di_{ph}/dt$ drops below the slope threshold) of a commutation cycle to estimate the BEMF ZC. The first moments of subsequent commutation cycles may be used to calculate the rotor velocity. The controller may predict the BEMF ZC of the next commutation based on the first moments of previous commutation cycles.

In the example illustrated in FIG. 7 the start time of the rising edge of the driving signal is calculated based on the predicted BEMF ZC. Moreover, also other timing parameters such as an optional lead angle for advancing the rising edge may be calculated based on speed information, and/or based on preset values.

In embodiments of the present invention the rising edge of a commutation cycle may be defined:
 1) in real time based on the first moment of the same commutation cycle;
 2) based on the first moments of previous commutation cycles;
 3) based on a combination of at least one previous and the actual first moment.

If the slope threshold equals zero, and neglecting any phase lag influence on the current, the first moment is the moment of the BEMF ZC, and represents the ideal moment to start the rising edge.

In practice, some phase lag induced by the motor coil inductance may be present. Especially at higher speeds, achieved by applying higher duty cycles, higher phase currents are flowing through the motor coil. In such case the rising edge is preferably started earlier. For that purpose, the slope threshold may be set>0. The amount of increase in the slope threshold will influence the amount of the so called lead angle which can be applied on the rising edge. For above case 2, a lead angle can be applied without increasing the threshold.

The slope threshold may be increased with an amount which is proportional to the peak current, and the rise time, approximated in first order as Lcoil/Rtotal, wherein Lcoil is the coil inductance and Rtotal=Rcoil+Rdson, and wherein Rcoil is the coil resistance and RDSon is the half bridge driver resistance.

In embodiments of the present invention the rise time may be fixed to ⅛ of an EHP. The slope threshold may then be set in an adaptive way by calculating it as a portion of [Ipeak/(EHP/8)]. Wherein the peak current Ipeak may be defined as the phase current at the moment or just before the falling edge is initiated, or as the peak current obtained throughout the last EHP. In embodiments of the present invention the slope threshold may be smaller than [Ipeak/(EHP/8)]. The FE control may be adapted for controlling the falling edge such that the absolute value of the phase current is reduced below a switch threshold before the rising edge of the driving signal in the commutation cycle. In this exemplary embodiment of the present invention the controller comprises an adaptive algorithm for controlling the timing of the falling edge of the driving signal, such that that absolute value of the current drops below a switch threshold just before the start of the determined start moment of the rising edge.

The controller may moreover comprise a power module (DCout control) for controlling the shape) of the driving signal. This shape may be controlled through an external input or can result from an internal regulation loop, such as a closed loop speed regulation loop.

The system moreover comprises a driver 240 configured for driving the single-coil BLDC motor using the driving signal determined by the controller 230. The driver 240 therefore gets its information from the control unit of the controller 230. The control unit itself gets its input from the FE control module, the RE control module and the DCout control module.

Figure 8:
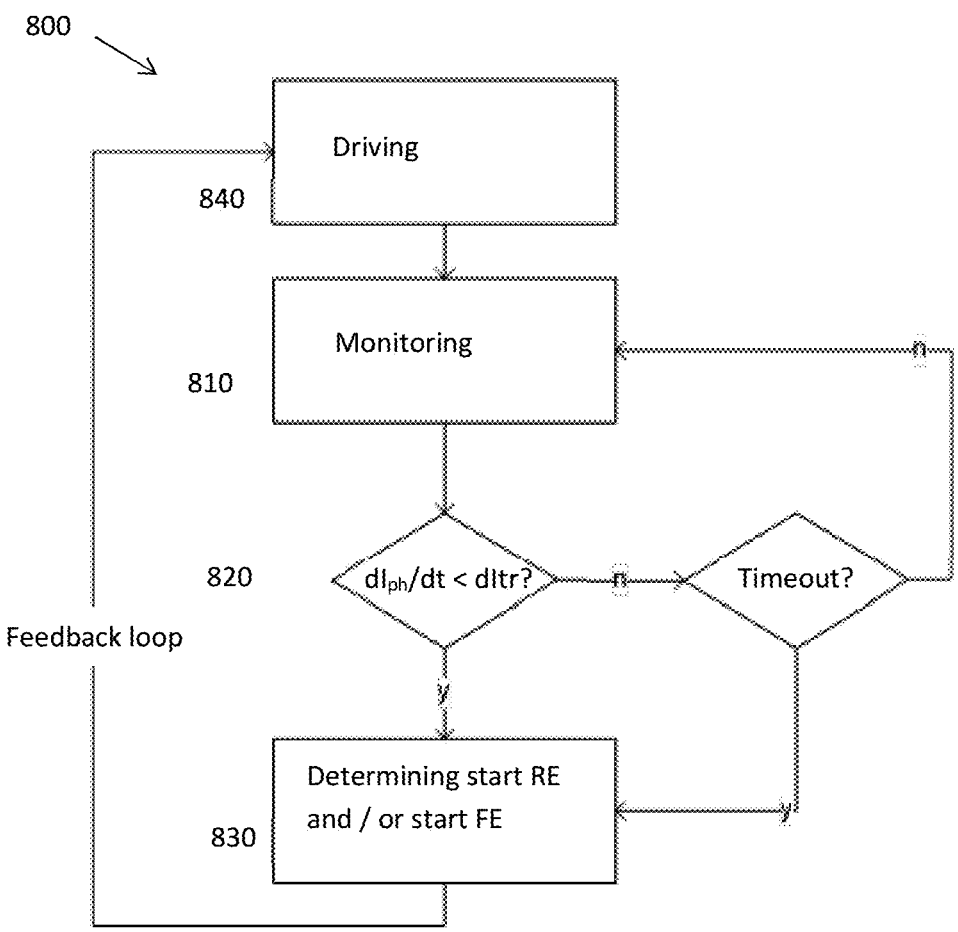
FIG. 8 shows a flow chart of method steps in according with embodiments of the present invention.

FIG. 8 shows a possible implementation example of method steps in according with embodiments of the present invention. These method steps may for example be implemented on a system as illustrated in FIG. 7.

FIG. 8 shows a step wherein the phase current is monitored 810 followed by a step wherein the time derivative of the phase current is compared with a slope threshold to determine 820 a first moment for which the absolute value of time derivative of the phase current is smaller than or equal to a slope threshold. If this is not yet the case and if a timeout (e.g. user definable or adjustable while running) has passed, a new phase current is sampled. If the first moment is determined, in a next step the start of the rising edge and the start of the falling edge are determined 830. This information is used as feedback information for driving 840 the single-coil BLDC motor. Thus, methods according to embodiments of the present invention enable adaptive control of the rising edge and of the falling edge of the driving signal.

Figure 9:
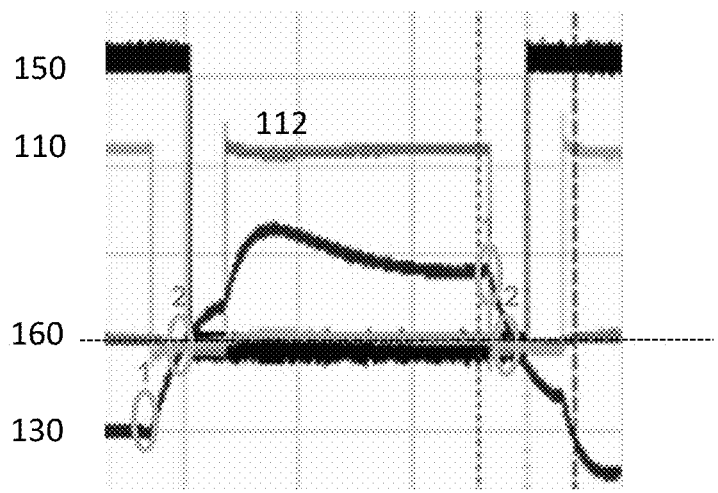
FIG. 9 shows the traces of different signals during a commutation cycle of a single-coil brushless DC motor.

FIG. 9 shows the traces of different signals during a commutation cycle of a single-coil BLDC motor. Curve 130 shows the phase current, curve 110 shows the driving signal on a first terminal (OUT1) of the motor coil, curve 112 shows the driving signal on the other (second) terminal (OUT2) of the motor coil, and curve 150 shows the FG output, indicating the Hall sensor based commutation point.

Figure 10:
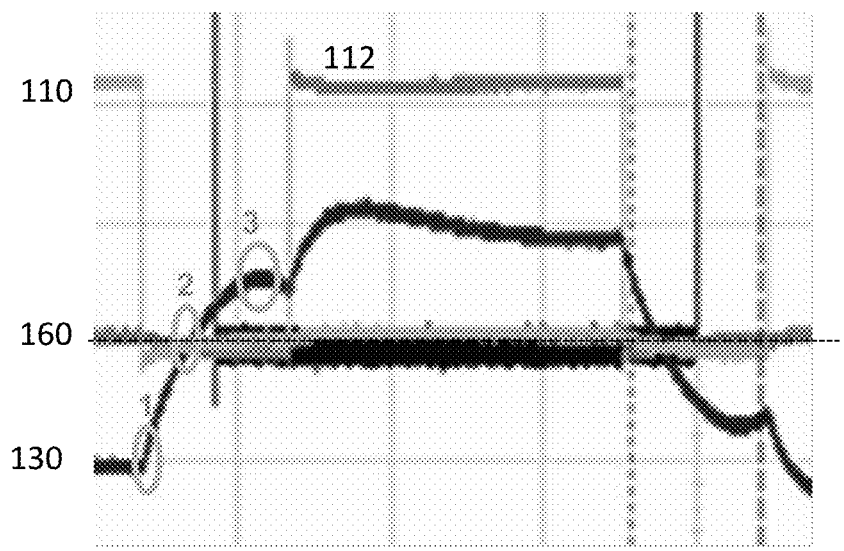
FIG. 10 is similar as FIG. 9 except that the falling edge of the driving signal is started sooner.
Figure 11:
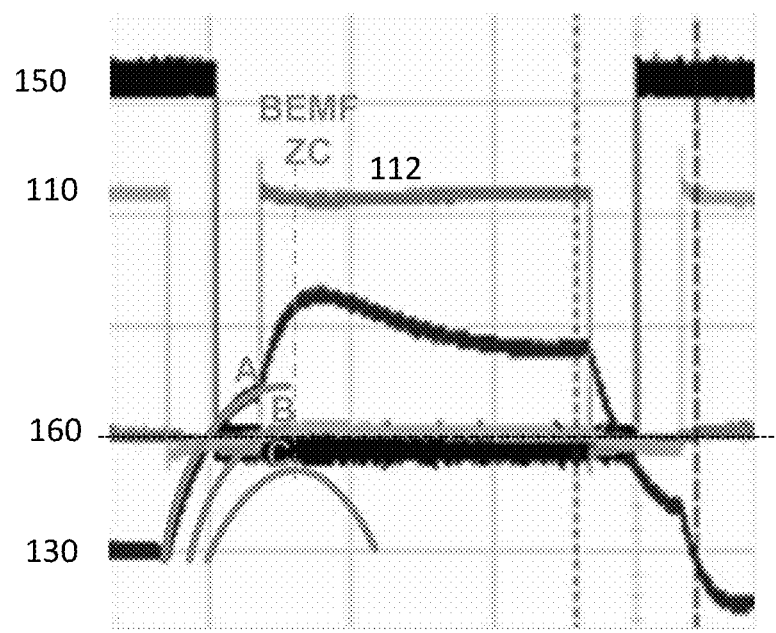
FIG. 11 is the same as FIG. 9 except for the curves A, B, C for different start moments of the falling edge of the driving signal on the first terminal.

In this example, the absolute value of the phase current is dropping below the switch threshold before the start of the rising edge of the driving signal 112 on the second terminal, in accordance with embodiments of the present invention. However, the rising edge of the driving signal still started before the absolute value of the time derivative of the phase current is smaller than or equal to a slope threshold. The falling edge of the driving signal 112 on the second terminal started too soon, such that the BEMF takes over the control of the current, and pushes the absolute value of the current to increase substantially, before the rising edge of the driving signal 110 on the first terminal. In FIGS. 9, 10 and 11 the zero crossing of the phase current is indicated by the horizontal dashed line 160. Above the dashed line the current is negative, below the dashed line the current is positive.

In FIG. 10 the falling edge of the driving signal 110 is started even sooner with regard to the phase current (compared to FIG. 9), and the rising edge of the driving signal 112 is started even later with regard to the phase current (compared to FIG. 9). In this example, the rising edge of the driving signal started so late that the absolute value of the phase current 130 increases even more up to a point 3 when it starts to drop again to zero. The change in $di_{ph}/dt$ at 3 is due to the rotor magnet which has changed polarity, and therefore the induced BEMF voltage changes polarity as well.

FIG. 11 is the same as FIG. 9 except for the curves A, B, C for different start moments of the falling edge of the driving signal 110 on the first terminal. Curve A corresponds with the actual case of the plot. The falling edge of the driving signal 110 on the first terminal is started too soon, and the current will overshoot to a substantial negative (or positive) value. At the start of the rising edge of the driving signal 112 on the second terminal $di_{ph}/dt$ is not yet zero.

Curve B is close to an optimal condition. The time derivative of the phase current ($di_{ph}/dt$) is approximately zero around the time that the phase current is approximately zero.

Curve C is an extrapolation in case the falling edge of the driving signal 110 is initiated too late, and the phase current does not have sufficient time to discharge from the coil. In a theoretical case, in which the absolute value of the phase current would not be reduced below the switch threshold, and the rising edge would not be initiated, the phase current will be increasing again, due to the BEMF which has already changed polarity. In such a case, or in a similar case wherein a certain threshold is not seen (e.g. because of noise, EMC) a timer, based on commutation events might force the system to a commutation based on the commutation history. This is a possible backup scenario because of the inertia of the single-coils brushless DC motor. Because there is still a dissipative component, and an inductive component in the phase current, the measured phase current isn't the perfect integral of the BEMF voltage over time.

Figure 12:
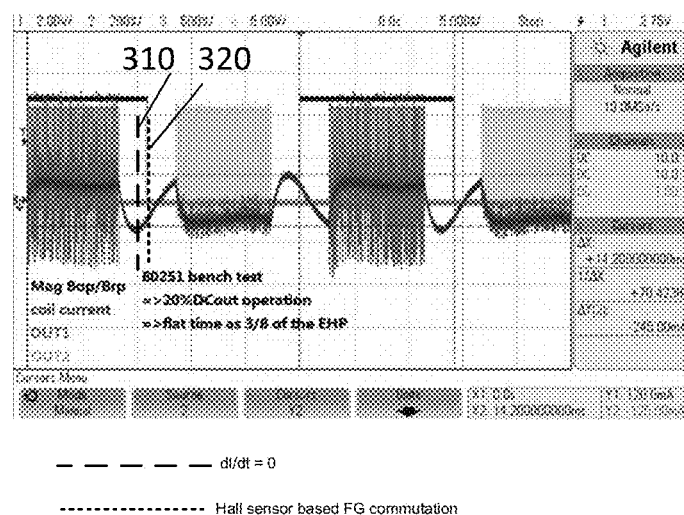
FIGS. 12, 13, and 14 show an example wherein a hall sensor based commutation signal is compared with the moment when the time derivative of the phase current is zero.
Figure 13:
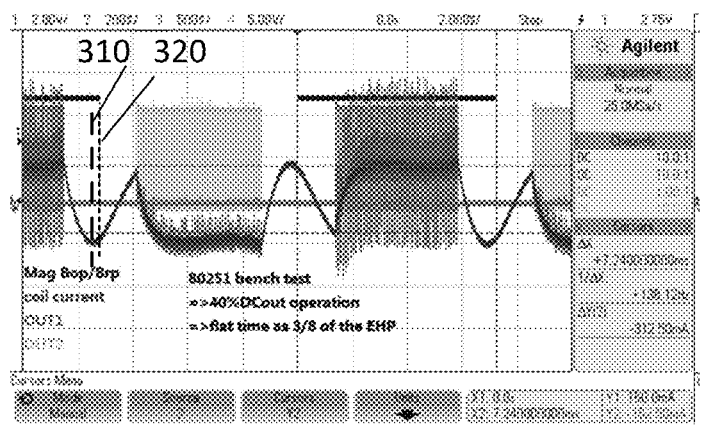
Figure 14:
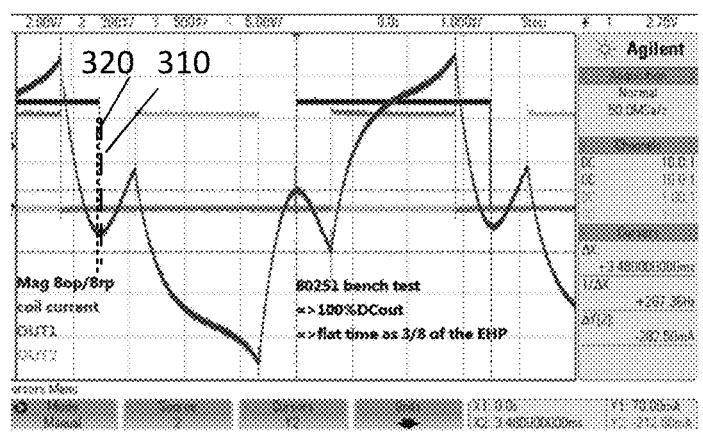

FIGS. 12, 13 and 14 show an example wherein a hall sensor based commutation signal, referred to as FG, is compared with the moment when $dI_{ph}/dt=0$. The figures show, how the "$dI_{ph}/dt=0$" moment (indicated by dashed line 310) is delayed compared to the FG commutation (indicated by dashed line 320) as the shape amplitude increases from 20% to 40% to 100%. In practice, it is preferred that the RE is advanced (lead angle), rather than delayed (lag angle), in order to compensate for induced phase lag. Therefore $dI_{ph}/dt=0$ is not the optimal point for all operating speeds. It may be acceptable at low speeds and/or low duty cycles, but the preferred embodiments allow to increase the threshold as the speeds and/or the output duty cycles increase.

In embodiments of the present invention the falling edge of the driving signal is determined such that the absolute value of the phase current is at a target level (smaller than the switch threshold) at the moment of the predicted BEMF ZC, to ensure the time derivative of the phase current ($di_{ph}/dt$) around the zero crossing of the BEMF voltage can be captured in a robust and reliable way.

The invention claimed is:

1. A method for controlling a single-coil brushless DC motor, the method comprising:
   monitoring a signal indicative of a time derivative of a phase current through the coil of the brushless DC motor during at least one commutation cycle,
   determining a first moment of the at least one commutation cycle such that at the first moment the absolute value of the time derivative of the phase current is smaller than or equal to a slope threshold,
   determining a rising edge of a driving signal in a commutation cycle, based on the first moment of that commutation cycle and/or based on the first moment of at least one earlier commutation cycle, and/or determining a falling edge of the driving signal in that commutation cycle based on the first moment of at least one earlier commutation cycle,
   driving the single-coil brushless DC motor using the driving signal defined in the determining step.

2. The method according to claim 1, wherein the driving signal is a pulse-width modulation signal or a linear controlled signal.

3. The method according to claim 2, wherein the driving signal is a pulse-width modulation signal and wherein the slope threshold is increased with an increasing duty cycle of the PWM input signal.

4. The method according to claim 1, wherein the current is measured at predefined intervals, or the time interval is measured at predefined current intervals.

5. The method according to claim 1, wherein the signal indicative of the time derivative of the phase current is monitored when the absolute value of the time derivative of the phase current is decreasing.

6. The method according to claim 1, wherein determining the rising edge of the driving signal, in the commutation cycle, is at least based on the first moment in at least one earlier commutation cycle.

7. The method according to claim 1, wherein monitoring the signal indicative of the time derivative of the phase current through the coil of the brushless DC motor is started when the absolute value of the phase current is reduced below a sensor threshold, or when the driving signal has an average voltage difference over the coil below a driving threshold, or at a predefined time or angular position after the start of the falling edge, or after the end of the falling edge.

8. The method according to claim 1 wherein monitoring the signal indicative of the time derivative of the phase current is stopped when the absolute value of the time derivative of the phase current drops below the slope threshold or at a predefined time out value or angular value after starting the monitoring.

9. The method according to claim 1 wherein determining the rising edge of a driving signal comprises determining a start moment of the rising edge and/or a shape of the rising edge and wherein determining the falling edge of a driving signal comprises determining a start moment of the falling edge and/or a shape of the falling edge.

10. The method according to claim 1, wherein the falling edge of the driving signal in a commutation cycle is determined such that the absolute value of the phase current is reduced below a switch threshold at a second moment such that the second moment is before the rising edge of the driving signal in the commutation cycle and/or before the first moment of the commutation cycle.

11. The method according to claim 10, wherein the rising edge of the driving signal for the next commutation cycle is determined based on the first moment and/or the second moment of the at least one earlier commutation cycle.

12. The method according to claim 1 wherein the phase current is monitored when the absolute value of the time derivative of the phase current is decreasing and wherein the slope threshold is increased with an increasing speed of the single-coil brushless DC motor and/or an increasing absolute value of the average phase current.

13. A system for controlling a single-coil brushless DC motor, the system comprising:
   a current sensor configured for monitoring a signal indicative of a time derivative of a phase current through the coil of a single-coil brushless DC motor, by doing subsequent current measurements and by calculating the signal indicative of the time derivative from these subsequent measurements, or by differentiating in analog domain, during at least one commutation cycle,
   a comparator configured for determining a first moment of the at least one commutation cycle when the absolute value of the time derivative of the phase current is smaller than or equal to a slope threshold,
   a controller configured for determining a rising edge of a driving signal in a commutation cycle, based on the first moment of that commutation cycle and/or based on the first moment of at least one earlier commutation cycle, and/or determining a falling edge of the driving signal in that commutation cycle based on the first moment of at least one earlier commutation cycle wherein the driving signal is suitable for driving the single-coil brushless DC motor,
   a driver configured for driving the single-coil brushless DC motor using the driving signal determined by the controller.

14. The system according to claim 13, wherein the driving signal is a pulse-width modulation signal or a linear controlled signal.

15. The system according to claim 14, wherein the driving signal is a pulse-width modulation signal and wherein the system is adapted for determining the slope threshold such that it increases with an increasing duty cycle of the PWM input signal.

16. The system according to claim 13 wherein the controller is configured for determining the rising edge of the driving signal in a commutation cycle, at least based on the first moment in at least one earlier commutation cycle.

17. The system according to claim 13 wherein the current sensor is configured for monitoring the signal indicative of the time derivative of the phase current through the coil of the brushless DC motor, by doing the subsequent current measurements and by calculating the signal indicative of the time derivative from these subsequent measurements, or by differentiating in the analog domain, when the absolute value of the phase current is reduced below a sensor threshold, or when the driving signal has an average voltage difference over the coil below a driving threshold, or at a predefined time or angular position after the start of the falling edge, or after the end of the falling edge.

18. The system according to claim 13 wherein the controller is configured for determining the falling edge of the driving signal in a commutation cycle such that the absolute value of the phase current is reduced below a switch threshold at a second moment such that the second moment is before the rising edge of the driving signal, and/or before the first moment in the commutation cycle.

19. The system according to claim 18 wherein the controller is configured for determining the rising edge of the driving signal for the next commutation cycle based on the first moment and/or the second moment of the at least one earlier commutation cycle.

20. A motor device comprising a single-coil brushless DC motor and a system according to claim 13 for driving the brushless DC motor.

21. A motorized system, comprising:
a motor device according to claim 20, the motor device comprising a rotor having a shaft; and
a mechanical load attached to the shaft.

* * * * *